US005699265A

United States Patent [19]
Scepanovic et al.

[11] Patent Number: 5,699,265
[45] Date of Patent: Dec. 16, 1997

[54] PHYSICAL DESIGN AUTOMATION SYSTEM AND PROCESS FOR DESIGNING INTEGRATED CIRCUIT CHIPS USING MULTIWAY PARTITIONING WITH CONSTRAINTS

[75] Inventors: Ranko Scepanovic; James S. Koford, both of San Jose, Calif.; Valeriy B. Kudryavtsev, Moscow, Russian Federation; Alexander E. Andreev, Moskovskaja Oblast, Russian Federation; Stanislav V. Aleshin; Alexander S. Podkolzin, both of Moscow, Russian Federation

[73] Assignee: LSI Logic Corporation, Milpitas, Calif.

[21] Appl. No.: 525,839

[22] Filed: Sep. 8, 1995

[51] Int. Cl.$^6$ ............................................ G06F 17/50
[52] U.S. Cl. .................................. 364/491; 364/488
[58] Field of Search ........................ 364/488, 489, 364/490, 491

[56] References Cited

U.S. PATENT DOCUMENTS

| | | | |
|---|---|---|---|
| 3,617,714 | 11/1971 | Kernighan | 364/488 |
| 5,187,784 | 2/1993 | Rowson | 395/500 |
| 5,359,538 | 10/1994 | Hui et al. | 364/491 |
| 5,513,124 | 4/1996 | Trimberger et al. | 364/491 |
| 5,521,836 | 5/1996 | Hartoog et al. | 364/491 |
| 5,566,078 | 10/1996 | Ding et al. | 364/490 |

OTHER PUBLICATIONS

Kernighan, W. and Lin, S., "An Efficient Heuristic Procedure for Partitioning Graphics",Bell System Technical Journal, 49, 1970, pp. 291–307.

Fiduccia, C.M. and Mattheyses, R.M., "A Linear Time Heuristics for Improving Network Partitions",Proc. of the 19th Design Automation Conference, 1982' pp. 175–181.

Kring, C. and Newton, A.R., "A Cell Replicating Approach to Mincut Based Circuit Partitioning",Proc. of IEEE International Conf. on CAD, 1991,pp. 2–5.

Wei, Y. and Cheng, C., "Towards Efficient Hierarchical Designs by Ratio Cut Partitioning",International Conf. on CAD, 1989, pp. 298–301.

Metropolis, N., Rosenbluth, A. and Rosenbluth, M., "Equation of State Calculations by Fast Computing Machines", Journal of Chemistry and Physics, 1993,pp. 1087–1092.

Saab, Y. and Rao, V., "Stochastic Evolution: A Fast Effective Heuristic for Some Generic Layout Problems", Proc. of Design Automation Conference, 1990,pp. 26–31.

Kleinhans, J., et al., "GORDIAN: VLSI Placement by Quadratic Programming and Slicing Optimization", IEEE Trans. on CAD, 1991, pp. 356–365.

Bertsekas, D., "Linear Network Optimization: Algorithms and Codes",MIT Press, Cambridge, MA, 1991, pp. 167–243.

Murty, K., "Network Programming",Prentice Hall, Englewood Cliffs, NJ, 1992,pp. 168–187.

Sechen et al., "An Improved Objective Function for Mincut Circuit Partitioning," ICCAD '88, pp. 502–505.

*Primary Examiner*—Kevin J. Teska
*Assistant Examiner*—Leigh Marie Garbowski
*Attorney, Agent, or Firm*—Oppenheimer Poms Smith

[57] ABSTRACT

A process for designing an integrated circuit chip includes specifying a set of cells, a set of wiring nets for interconnecting the cells, and a set of regions on the chip in which the cells are to be placed. An assignment of the cells of the set to the regions is generated, and the set of cells is randomly divided into a first subset of cells which remain in the assignment, and a second subset of cells which are removed from the assignment. Penalties are computed for assigning the cells of the second subset to the regions respectively, and the cells of the second subset are assigned to the regions such that a total penalty thereof is minimized. The process is repeated iteratively with the size of the second subset being progressively reduced relative to the size of the first subset until an end criterion is reached.

22 Claims, 15 Drawing Sheets

| $\lambda_{r,1,2}$ | $\lambda_{r,1,3}$ | $\lambda_{r,1,4}$ |
|---|---|---|
| $\lambda_{r,2,1}$ | $\lambda_{r,2,3}$ | $\lambda_{r,2,4}$ |
| $\lambda_{r,3,1}$ | $\lambda_{r,3,2}$ | $\lambda_{r,3,4}$ |
| $\lambda_{r,4,1}$ | $\lambda_{r,4,2}$ | $\lambda_{r,4,3}$ |

| $\lambda_{1,1,2}$ | $\lambda_{2,1,2}$ | • • • • | $\lambda_{k,1,2}$ |
|---|---|---|---|

PHYSICAL DESIGN AUTOMATION SYSTEM AND PROCESS FOR DESIGNING INTEGRATED CIRCUIT CHIPS USING MULTIWAY PARTITIONING WITH CONSTRAINTS

BACKGROUND OF THE INVENTION

1. Field of the Invention

The present invention generally relates to the art of microelectronic integrated circuits, and more specifically to a physical design automation system and process for designing integrated circuit chips using multiway partitioning with constraints.

2. Description of the Related Art

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield. The arrangement of individual cells in an integrated circuit chip is known as a cell placement.

Each microelectronic circuit device or cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

Prior art methods for achieving this goal comprise generating one or more initial placements, modifying the placements using optimization methodologies including Genetic Algorithms such as simulated evolution, force directed placement or simulated annealing, and comparing the resulting placements using a cost criteria.

In conventional chip design, the positions of certain "unmovable" cells (external interconnect terminals or pads, large "megacells" etc.) will be fixed a priori by the designer. Given those fixed positions, the rest of the cells are then placed on the chip. Since the unmovable cells and pads are located or placed before the placement for the rest of the cells of chip has been decided on, it is unlikely that the chosen positions will be optimal.

In this manner, a number of regions, which may have different sizes and shapes, are defined on the chip for placement of the rest of the cells.

It is desirable to assign individual microelectronic devices or cells to the regions, or "partition" the placement such that the total interconnect wirelength is minimized. However, methodologies for accomplishing this goal efficiently have not been proposed heretofore.

The general partitioning methodology is to hierarchically partition a large circuit into a group of smaller subcircuits until each subcircuit is small enough to be designed efficiently. Because the quality of the design may suffer due to the partitioning, the partitioning of a circuit has to be done carefully.

One of the most common objectives of partitioning is to minimize the cutsize which is defined as a number of nets crossing a cut. Also the number of partitions often appears as a constraint with upper and lower bounds. At chip level, the number of partitions is determined, in part, by the capability of the placement algorithm.

The prior art accomplishes partitioning by means of a series of "bipartitioning" problems, in which a decision is made to assign a component to one of two regions. Each component is hierarchically bipartitioned until the desired number of components is achieved. Group migration algorithms such as Kernighan-Lin "min-cut" algorithm and its extensions and the applications of the simulated annealing and simulated evolution to the partitioning problem do not take into account the relative positions of future partitions on the plane.

The Kernighan-Lin algorithm is described in "An Efficient Heuristic Procedure for Partitioning Graphs", W. Kernighan and S. Lin, Bell System Technical Journal, 49, pp. 291–307, 1970. Its extensions are described in "A Linear Time Heuristics for Improving Network Partitions", C. M. Fiduccia and R. M. Mattheyses, Proc. of the 19th Design Automation Conference, pp. 175–181, 1982; "A Cell Replicating Approach to Mincut Based Circuit Partitioning", C. Kring and A. R. Newton, Proc. of IEEE International Conf. on CAD, pp. 2–5 1991; and "Towards Efficient Hierarchical Designs by Ratio Cut Partitioning", Y. Wei and C. Cheng, International Conf. on CAD, pp. 298–301, 1989.

Simulated annealing is described in "Equation of State Calculations by Fast Computing Machines", N. Metropolis, A. Rosenbluth and M. Rosenbluth, Journal of Chemistry and Physics, pp. 1087–1092, 1993. Simulated evolution is described in "Stochastic Evolution: A Fast Effective Heuristic for Some Generic Layout Problems", Y. Saab and V. Rao, Proc. of Design Automation Conference, pp. 26–31, 1990.

These algorithms can not simultaneously solve the partitioning problem and the problem of placing partitions on the chip, and thereby their applicability to physical design automation systems for integrated circuit chip design is limited.

SUMMARY OF THE INVENTION

A physical design automation system and process for designing an integrated circuit chip in accordance with the present invention comprises specifying a set of cells, a set of wiring nets for interconnecting the cells, and a set of regions on the chip in which the cells are to be placed.

An assignment of the cells of the set to the regions is generated, and the set of cells is randomly divided into a first subset of cells which remain in the assignment, and a second subset of cells which are removed from the assignment. Penalties are computed for assigning the cells of the second subset to the regions respectively, and the cells of the second subset are assigned to the regions such that a total penalty thereof is minimized.

The process is repeated iteratively with the size of the second subset being progressively reduced relative to the size of the first subset until an end criterion is reached.

The present invention solves the partitioning problem and the problem of placing the partitions on the chip simultaneously, therefore overcoming the drawbacks of the prior art. This is accomplished by concurrently assigning cells to more than two regions (multiway), as compared to only two regions (bipartitioning) as in the prior art.

The present invention is also capable of improving on an initial partitioning or assignment produced using a min-cut or other methodology, and can also be considered as a placement improvement process.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
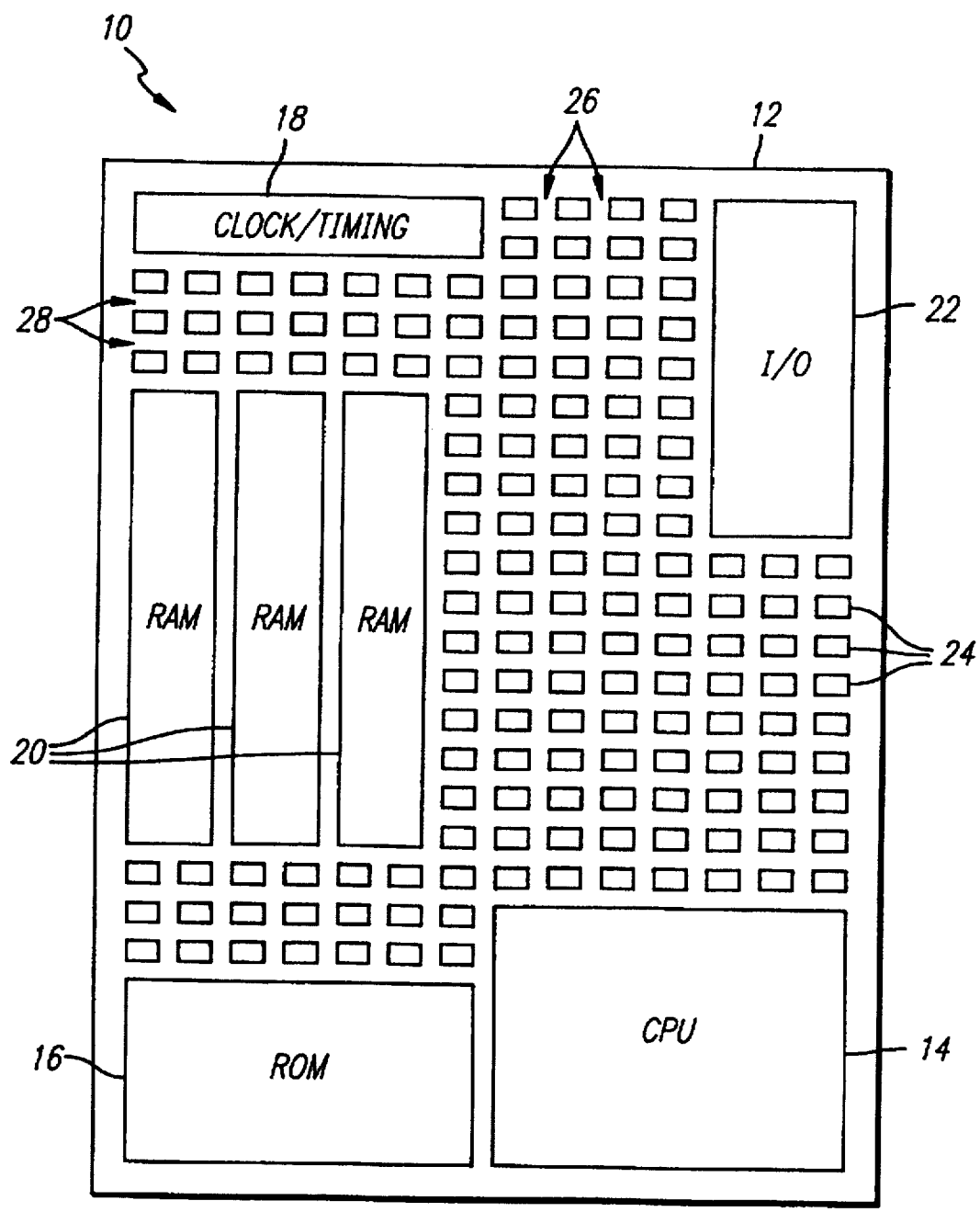
FIG. 1 is a simplified diagram illustrating an integrated circuit chip which can be optimally designed in accordance with the present invention.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24.

Figure 2:
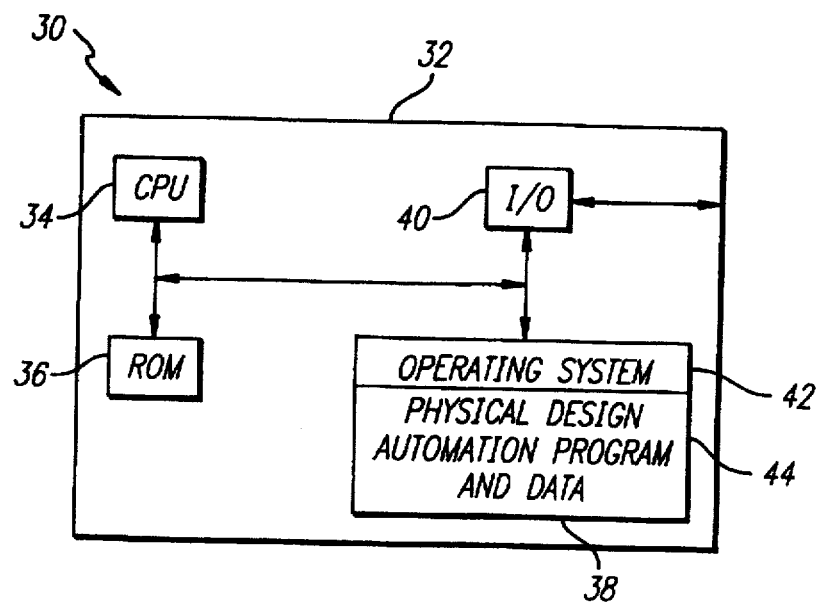
FIG. 2 is a block diagram of a physical design automation system according to the present invention as embodied by a programmed digital computer.

FIG. 2 illustrates an integrated circuit physical design automation system 30 for producing an optimized placement of the cells 24 such as illustrated in FIG. 1 in accordance with a method or process of the present invention. The system 30 comprises a programmed digital computer 32 which may be of conventional type, including a processor such as a Central Processing Unit 34, a Read Only Memory (ROM) 36 for storing firmware, a Random Access Memory (RAM) 38 for storing an operating program and data, and an Input-Output (I/O) 40 for connecting the computer 32 to external devices.

The RAM 38 stores an operating system 42 such as UNIX, and a physical design automation program and data 44 for implementing the process of the present invention. The system 30 performs its function of physical design automation by causing the CPU 34 to execute the operating program 44 using input parameters specified by a user.

Figure 3:
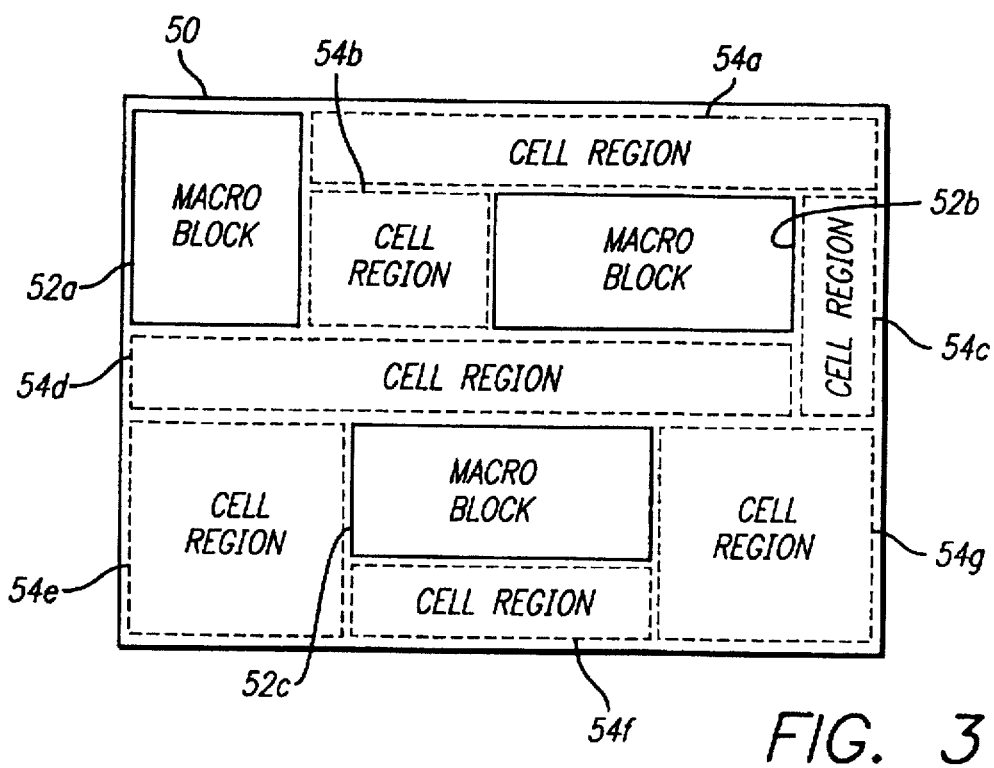
FIG. 3 is a diagram illustrating an integrated circuit chip including a plurality of macroblocks, and regions in which cells are to be placed by the present physical design automation system.

FIG. 3 illustrates one arrangement of regions in which cells are to be assigned or placed. An integrated circuit chip 50 includes a plurality of fixed macroblocks 52a to 52c as described with reference to FIG. 1. The irregularly shaped area which is not covered by the macroblocks 52a to 52c is divided into rectangular cell regions 54a to 54g having different sizes and shapes. A large number of cells, which are not illustrated in FIG. 3, are to be assigned to the regions 54a to 54g.

Figure 4:
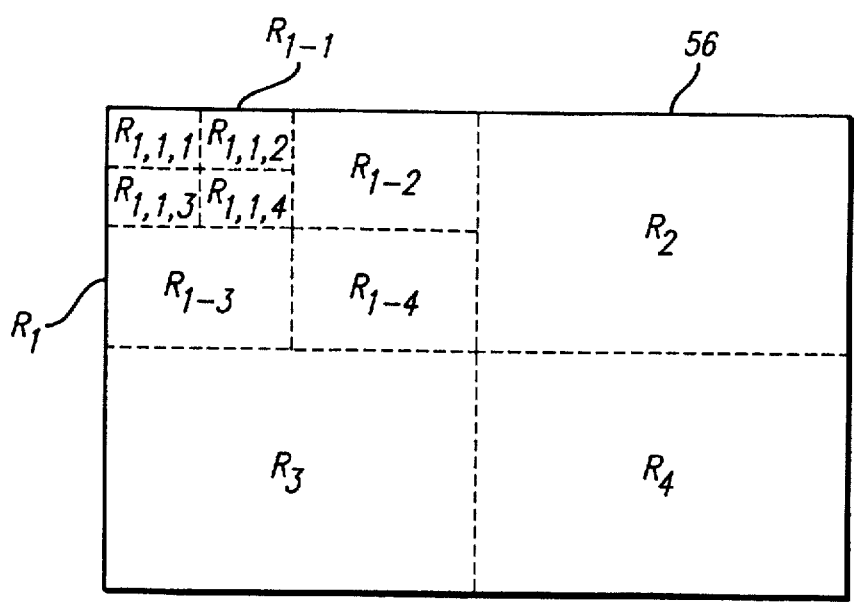
FIG. 4 is similar to FIG. 3, but illustrates a chip which is hierarchically partitioned into progressively smaller regions.

FIG. 4 illustrates another arrangement of regions in which cells are to be assigned or placed. An integrated circuit chip 56 has a single area in which a large number of cells are to be placed in a "Sea of Gates" configuration. The chip 56 is hierarchically divided into a plurality of regions and subregions. For example, as illustrated, the chip 56 is initially divided into four regions $R_1$ to $R_4$, which are in turn divided into four subregions.

For simplicity of illustration, only four subregions $R_{1-1}$ to $R_{1-4}$ of the region $R_1$ are shown in the drawing. The subregions can themselves be subdivided into subregions, down to any number of levels. For example, the subregion $R_{1-1}$ is shown as being subdivided into four subregions $R_{1-1-1}$ to $R_{1-1-4}$.

It is further within the scope of the invention to combine the arrangements of FIGS. 3 and 4. For example, the cell region 54a of FIG. 3 can be hierarchically subdivided into subregions as illustrated in FIG. 4. The designation of regions in which cells, wiring segments, etc. are to be assigned is arbitrary, specified by the user, and is not limited to any particular configuration within the scope of the invention.

Figure 5:
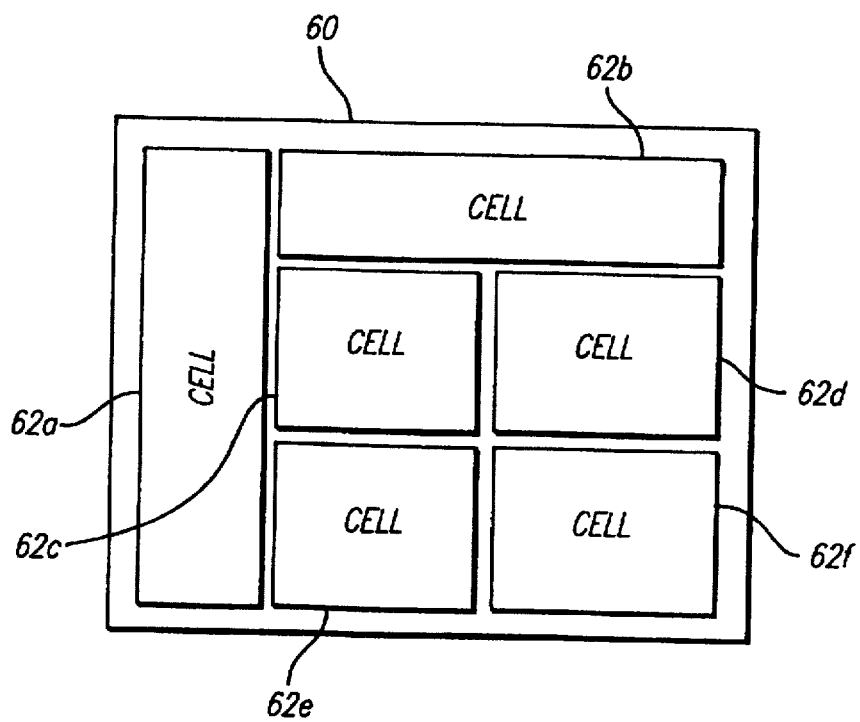
FIG. 5 is a diagram illustrating how cells which are placed by the present system can have different sizes and shapes.

Further, as illustrated in FIG. 5, cells which are to be assigned to regions can have the same size and shape or, as illustrated, have different sizes and shapes. For example, a region 60 can have cells 62a to 62f having different heights and widths assigned to and placed therein.

The following conventions will be used in the detailed description of the present invention.

| | |
|---|---|
| H | hypergraph |
| $Q_h$ | net |
| h | index for net |
| q | subset of nets connected to a cell |
| T | subset of regions containing cells of one net |
| $O_i$ | cell (object or vertex) |
| i | index for cell |
| n | number of cells |
| $S_i$ | size of cell |
| $R_j$ | region |
| j | index for region |
| m | number of regions |
| $c_j$ | capacity of region |
| ψ | penalty |
| Ψ | normalized penalty |
| ΔΨ | normalized penalty change |
| F | assignment |
| p | permutation |
| $I_r$ | subinterval |
| r | index for subinterval |
| k | number of subintervals |
| x | subinterval corresponding to $V_L$ |
| δ | accuracy parameter |

-continued

| | |
|---|---|
| M | maximum normalized penalty |
| $V_L$ | group size |
| L | index for group size |
| $V_T$ | maximum group size |
| $V_o$ | optimal group size |
| C | group size constant |
| λ | total size of objects in subinterval |
| Ω | change of cost function for moving $V_L$ group size |

The present invention provides a process which is preferably implemented by a programmed digital computer for partitioning a large number, for example several hundred thousand or more, microelectronic device cells into a relatively small number of regions on an integrated circuit chip.

The process of partitioning involves assigning individual cells to the regions of the chip such that a cost or penalty function, such as total wirelength of the placement, is minimized. The problem which is solved by the invention can be alternatively be described as partitioning or assignment of cells to regions.

Expressed using the notation of graph and set theory, the problem comprises specifying a hypergraph H consisting of a set O of vertices (objects), a set Q of hyperedges, and sizes s of the objects such that H=(O,Q,s).

In the present application of design automation for integrated circuit chips, the hypergraph represents the input data specifying the cells which are to be placed on the chip, and the wiring which interconnects the cells. The set O of vertices or objects represents the set of cells, the set Q of hyperedges represents the wiring nets which interconnect the cells, and the sizes s represent the sizes of the cells.

The problem also comprises specifying a set R of regions into which the cells are to be partitioned (assigned or mapped), and a set c of the sizes of the regions. The set R of regions represents the regions or areas on the chip in which the cells are to be placed, and the set c of sizes represents the sizes or capacities of the regions for containing cells expressed as area, height or width.

The present invention simultaneously partitions or assigns cells to all regions simultaneously, and therefore can be described as "multiway", as opposed to the prior art two way partitioning as represented by the min-cut algorithm.

Solution of the problem consists of finding a partitioning or assignment F:O→R which is subject to the following constraints $$(\forall j \in R) \left( \sum_{i \in O, F(i)=j} s(i) \leq c(j) \right)$$

Figure 7:
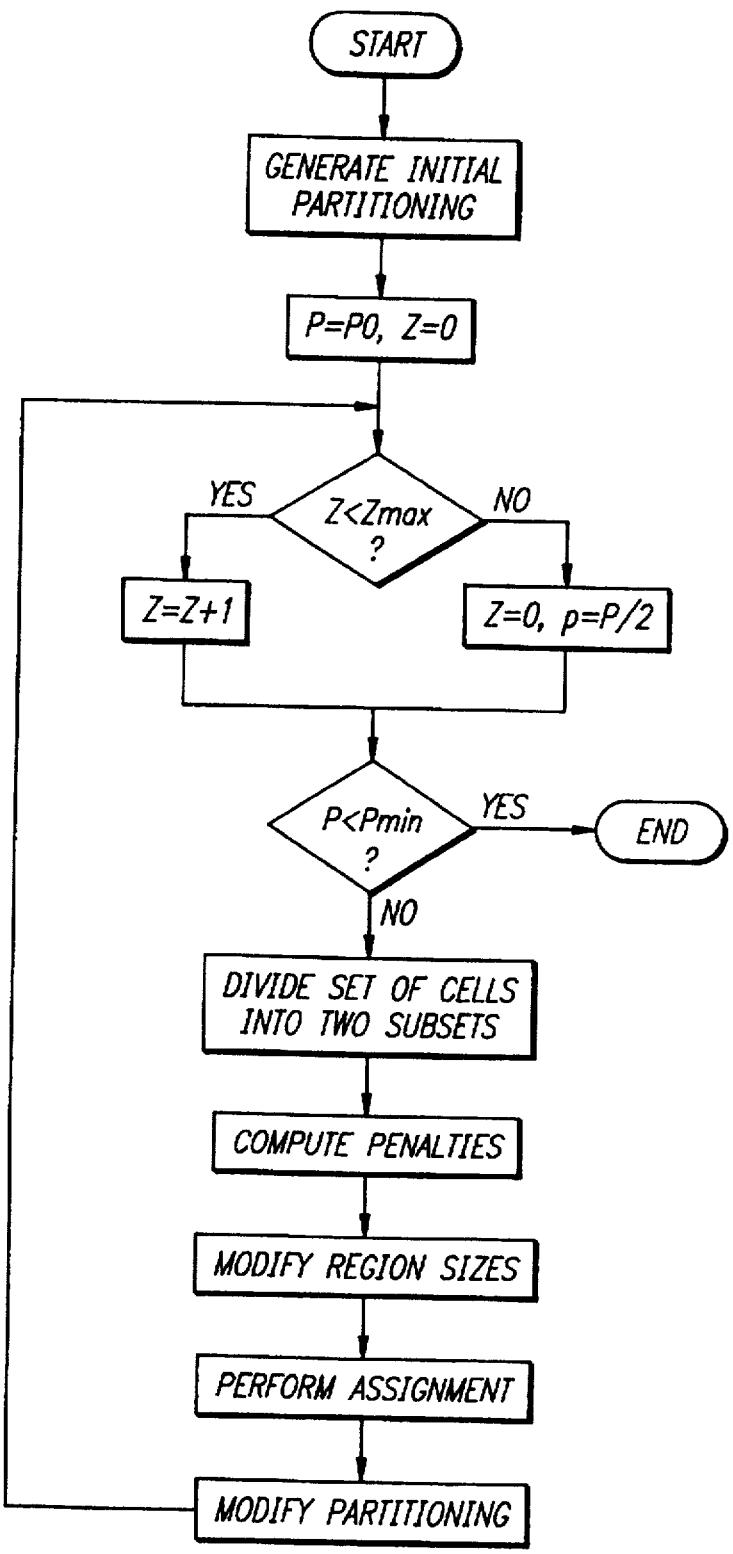
FIG. 7 is a flowchart illustrating the process of the present invention.

The steps of the present process are illustrated in FIG. 7. The first step is to generate an initial placement either randomly, or using a methodology such as an optimization-driven placement technique as described in an article entitled "GORDIAN: VLSI Placement by Quadratic Programming and Slicing Optimization", by J. Kleinhans et al, IEEE Trans. on CAD, 1991, pp. 356–365. Another alternative for generating the initial placement is a force directed placement method.

An initial partitioning can be generated randomly, using a S greedy algorithm such as min-cut, or using any other method as long as the capacities $c_j$ of the regions $R_j$ are not exceeded as indicated above.

The next step of the process is to set a probability factor p equal to an initial value $p_o$, and to set a number of iterations z equal to 0.

Then, a decision branch determines if z has reached a maximum value $z_{max}$, indicating that the process has been performed a predetermined number ($z_{max}$) of times without changing the probability factor p. If z is less than $z_{max}$, the value of z is incremented and the processes continues to the next step. If z has reached $z_{max}$, z is reset to zero and the probability factor p is reduced by a factor of 2.

It will be noted that it is within the scope of the invention to progressively reduce the probability factor p in any appropriate manner other than division by 2.

In either case, the process then determines if the probability factor p has been reduced below a minimum value $p_{min}$. This represents an end criterion. If the probability factor p has not been reduced below $p_{min}$, the process continues to the next step. If p has been reduced below $p_{min}$, the process terminates.

In the next step, the set of all cells is randomly divided into two subsets, a first subset $V_1$ of cells which remain on the chip, and a second subset $V_2$ of cells which are removed from the chip. Then, as will be described in detail below, penalties are computed for assigning each cell of the second subset $V_2$ to each region $R_j$ on the chip. The sizes or capacities $c_j$ of the regions from which the cells of the second subset $V_2$ were removed are recalculated such that their values are increased by the sizes $s_i$ of the removed cells.

Then, the cells of the second subset $V_2$ are assigned to the regions $R_j$ on the chip such that a total penalty is minimized. This is preferably performed using an assignment method of the invention which will be described in detail below, but can alternatively be performed using a prior art algorithm such as the "Auction" or "Hungarian" algorithm.

The Auction algorithm is described in, for example, a textbook entitled "Linear Network Optimization: Algorithms and Codes", by D. Bertsekas, MIT Press, Cambridge, Mass., 1991. pp. 167-243. The Hungarian algorithm is described in, for example, a textbook entitled "Network Programming", by K. Murty, Prentice Hall, Englewood Cliffs, N.J., 1992, pp. 168-187.

After performing the step of assigning the cells of the second subset $V_2$ to regions $R_j$, the process branches back to the step of determining whether the value of z has increased above $z_{max}$.

In summary, an initial placement is generated, and the set of all cells is divided into a first subset of cells which remain on the chip, and a second subset of cells which are removed from the chip. The size of the second subset is progressively reduced relative to the size of the first subset until an end criterion is reached.

For each value of the size of the second subset (corresponding to each value of the probability factor p), the process steps are iteratively performed a number of times which is determined by incrementing the value of z from 0 to $z_{max}$.

The process steps which are iteratively performed cause randomly selected groups of cells to be "ripped up" and reassigned to different regions of the chip such that the total penalty is minimized. In this manner, the partitioning or assignment of the placement is iteratively improved until an optimal configuration is reached.

The present method can be applied for improving an initial placement and partitioning including a fixed number of regions. Alternatively, an initial placement can be hierarchically divided into progressively smaller regions as described above until a sufficiently fine level of detail is reached in which each cell is optimally placed in a region which does not contain any other cells.

The process of FIG. 7 will now be described in detail with reference to FIGS. 8 to 20 of the drawings.

It is necessary to define a penalty or cost function for measuring the quality of a partitioning or assignment. This can be the cost function from the above referenced GORDIAN algorithm, which expresses total wirelength of the placement as the sum of squares of euclidian distances from the hyperedge vertices (cells) to gravity points of the nets of cells.

Figure 8:
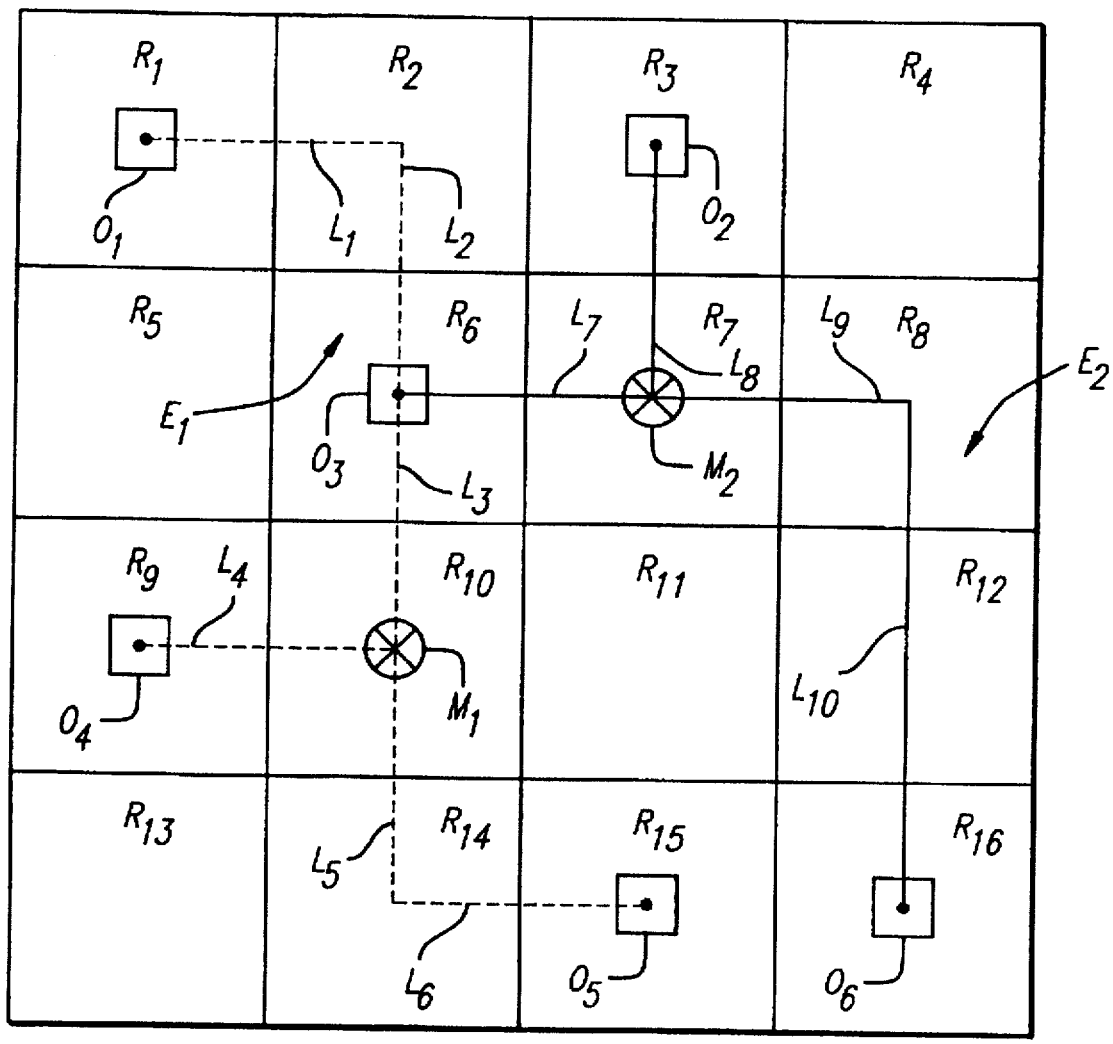
FIG. 8 is a diagram illustrating computation of wirelength in an integrated circuit cell placement.

Alternatively, total wirelength for each net can be computed as rectilinear distances as illustrated in FIG. 8, which presents an exemplary set R of 16 regions $R_1$ to $R_{16}$, and a set O of 6 cells $O_1$ to $O_6$. The cells $O_1$ to $O_6$ are placed in or assigned to the regions $R_1$, $R_3$, $R_6$, $R_9$, $R_{15}$ and $R_{16}$ respectively. A first net or hyperedge $E_1$ interconnects the cells $O_1$, $O_3$, $O_4$ and $O_5$, whereas a second net $E_2$ interconnects the cells $O_2$, $O_3$ and $O_6$. It will be noted that the cell $O_3$ has connections to both nets $E_1$ and $E_2$ through different pins.

The total wirelength $\theta$ of a net can be approximated as follows $$\theta = \sum_{j \in T} (|XB(j) - Xmed(T)| + |YB(j) - Ymed(T)|)$$

where T is a subset of the regions R which contain cells of one net, (XB(j),YB(j)) are the X and Y coordinates of the center of the region $R_j$, and (Xmed(T), Ymed(T)) are X and Y coordinates of the median of the subset T.

A median is a value in an ordered set of values below and above which there is an equal number of values, or which is the arithmetic mean of the two middle values if there is no one middle value.

The arithmetic mean will not necessarily coincide with a center of a region. It is further within the scope of the invention to define a median interval between two middle values, consisting of the entire space between the middle values, and define any location within the median interval to be a median.

Alternatively, if there are two middle values, one or the other of the middle values can be selected to represent the median. This will cause the median to coincide with the center of a region.

The net $E_1$ contains four cells, and the X coordinate of the median is between the centers of the regions $R_6$ and $R_9$ which contain the cells $O_3$ and $O_4$, with two cells being above and two cells being below the median. Similarly, the Y coordinate of the median of the net $E_1$ is between the centers of the regions $R_1$ and $R_6$.

In order to place the median at the center of one of the regions, a median $M_1$ of the net $E_1$ will be defined at the center of the region $R_{10}$, as corresponding to the X coordinate of the region $R_6$ which contains the cell $O_3$, and the Y coordinate of the region $R_9$ which contains the cell $O_4$. As stated above, if there are two middle values, one or the other of the middle values can be selected to represent the median. The net $E_2$ has an odd number of values, and a median $M_2$ at the center of the region $R_7$.

It will be noted that the medians $M_1$ and $M_2$ convert the hyperedges or nets $E_1$ and $E_2$ into rectilinear Steiner trees in which the medians $M_1$ and $M_2$ are single Steiner points. The Steiner points could be located at other points within a bounding box enclosing the nets and produce the same total wirelength.

Taking the distance between two rectilinearly adjacent regions as a unit of measure, the total wirelength of the net $E_1$ as expressed above is the sum of the broken lines illustrated in FIG. 8, consisting of segments $L_1$ to $L_6$ having a total length of 6 units. The total wirelength of the net $E_2$ is represented by the total length of solid line segments $L_7$ to $L_{10}$ having a total length of 5 units.

The total wirelength of a placement is the algebraic sum of θ for all nets, in this case 6+5=11 units.

The random partitioning of the set O of cells into two disjoint pieces can be expressed as $$O = V_1 \cup V_2 \text{ and } V_1 \cap V_2 = \phi$$

such that every cell $i \in O$ belongs to $V_2$ with the probability p, otherwise i is in $V_1$. If b the number of cells in $V_2$, then ξ is one-to-one mapping of the elements of $V_2$ to a set of integers that index $V_2$, $\xi: V_2 \rightarrow \{1 \ldots b\}$, and $\xi^{-1}$ its inverse mapping.

Figure 9:
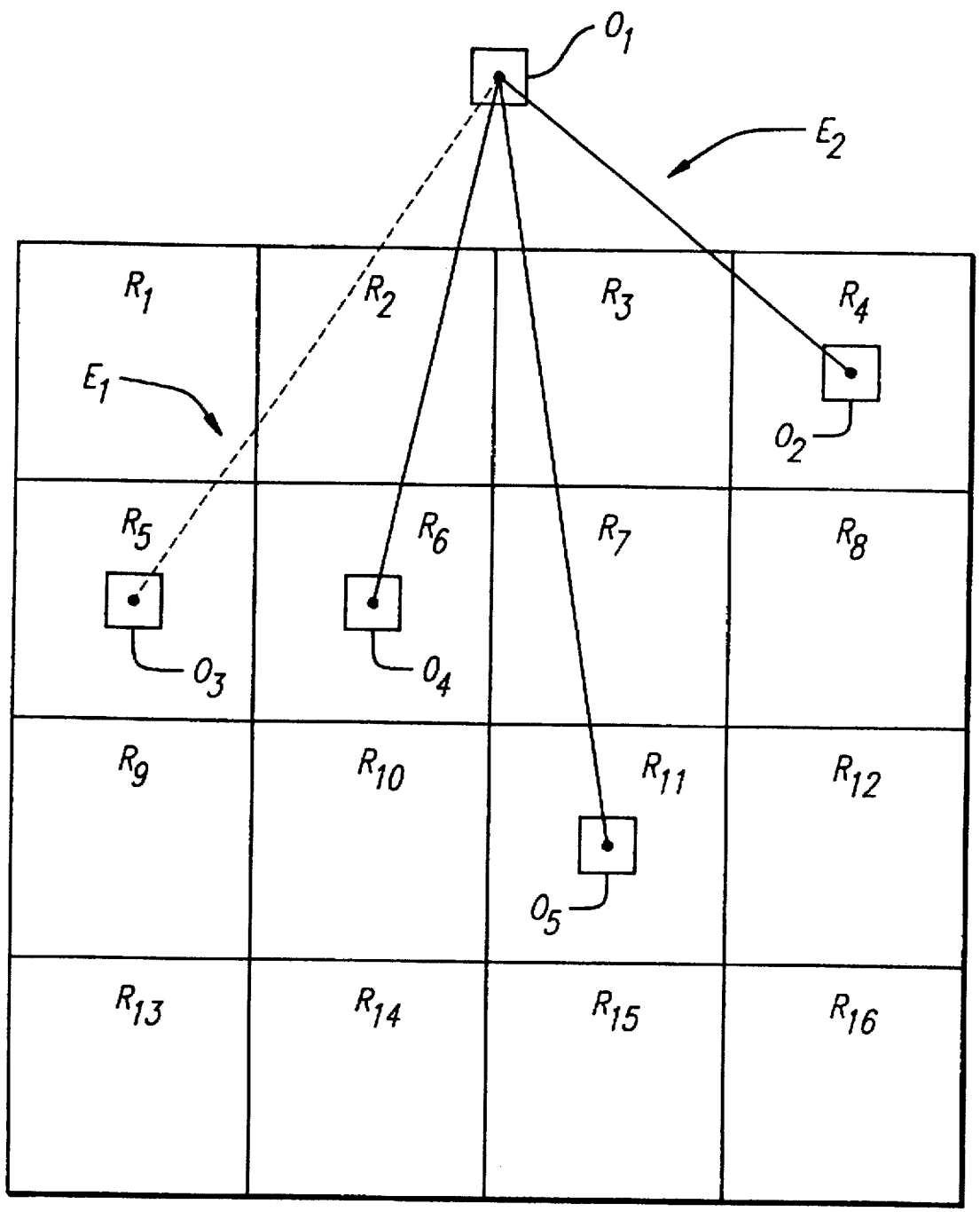
FIG. 9 is a diagram illustrating how a cell is removed from a placement in accordance with the invention.
Figure 10A:
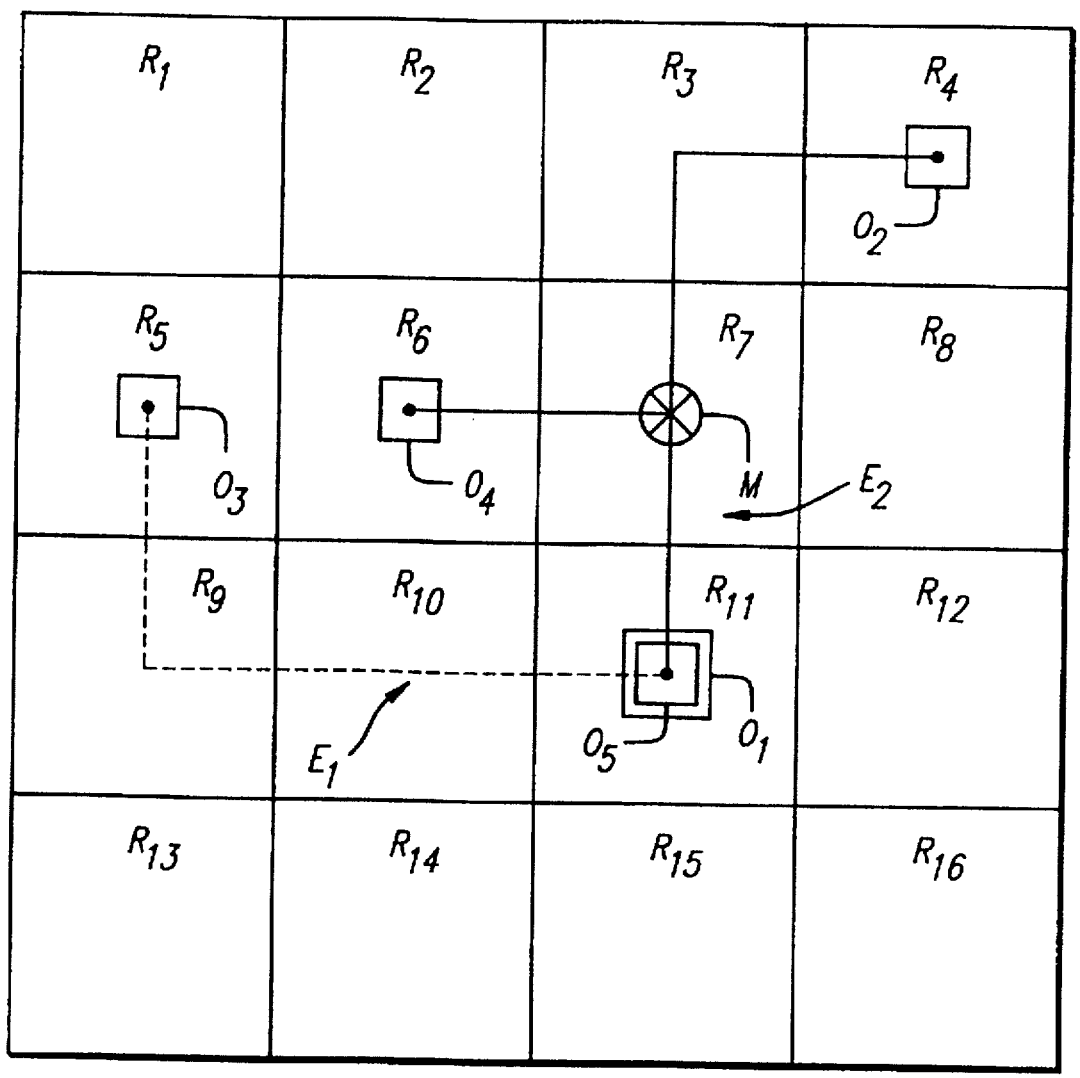
FIGS. 10a and 10b are diagrams illustrating how the cell which was removed in FIG. 9 can be reassigned to two different regions and the wirelength computed for the two cases.
Figure 10B:
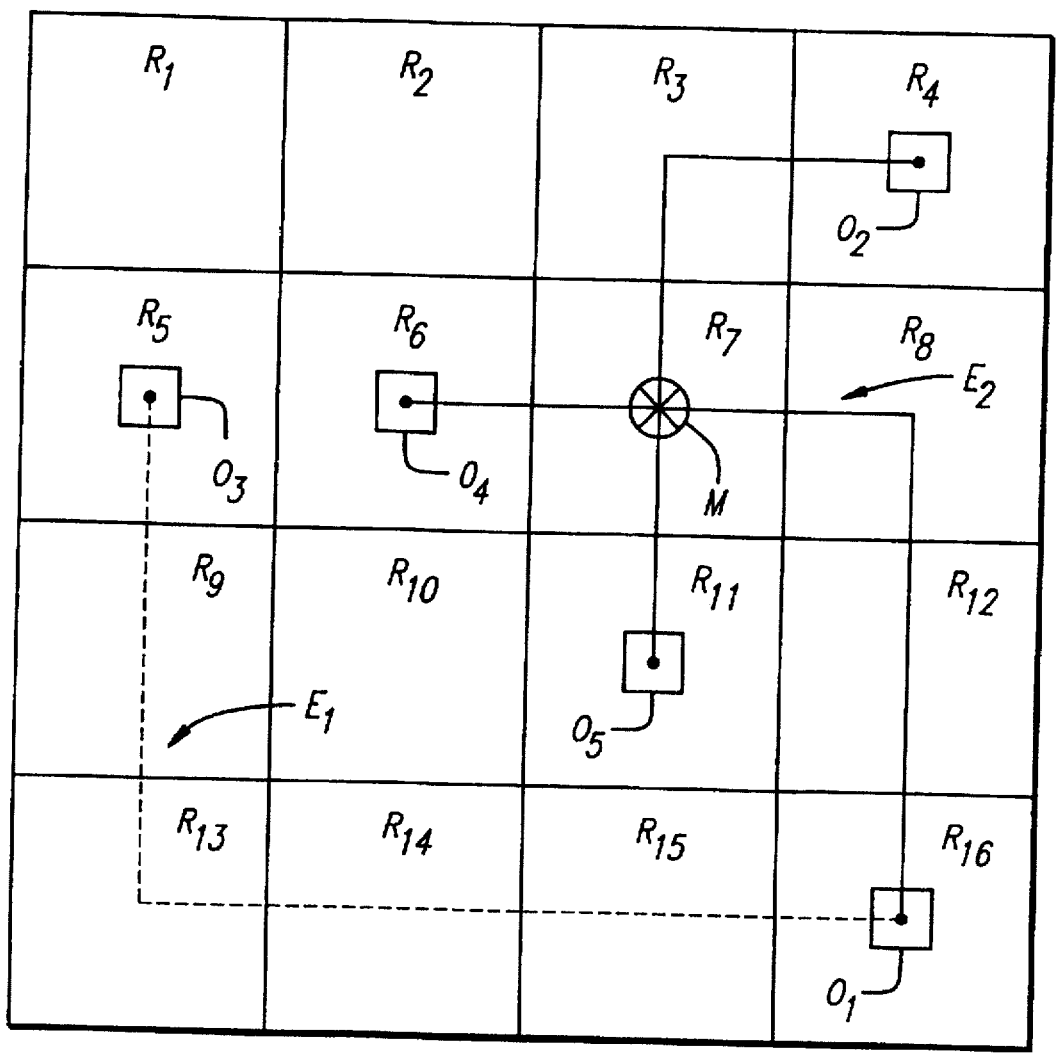

FIGS. 9, 10a and 10b illustrate how the penalty $\psi^*$ for a cell of the subset $V_2$ which is removed from a chip cell placement as described above with reference to FIG. 7 can be computed for assigning the cell to each region of the placement. It will be assumed that a cell $O_1$ has been removed, and that it is connected to a cell $O_3$ by a 2-pin net $E_1$ shown in broken line, and to cells $O_2$, $O_4$ and $O_5$ by a 4-pin net $E_2$ shown in solid line.

The cell $O_1$ can be placed in or assigned to any of the regions $R_1$ to $R_{16}$. A penalty $\psi$ for assigning a cell to a region is the total wirelength of all nets connected to the cell. This can be expressed as $\psi: V_2 \times R \rightarrow R$, where $\psi(i,j)$ is the penalty for placing the cell $O_i$ in the region $R_j$.

A total penalty $\psi^*$ for assigning a cell of the group $V_2$ to the regions R is given as $$\Psi^*(i,j) = \Psi(i,j) + \sum_{q \in Q, (i \in q) \wedge (q \cap V_1 \neq \phi)} \theta(F(q \cap V_1 \cup \{j\}))$$

where q is a subset of nets of Q which are connected to the cell $O_i$, and intersects $V_1$.

The quantity $\psi(i,j)$ is an initial condition which may or may not be specified along with the list of cells and the netlist. If no initial conditions are specified, this quantity is zero.

FIG. 10a illustrates the penalty for assigning the cell $O_1$ to the region $R_{11}$. The two pin net $E_1$ has a total wirelength of 3 units. The net $E_2$ has a median M, and a total wirelength of 4 units. The penalty $\psi^*$ is equal to the sum of the total wirelengths of the nets, or 3+4=7 units, assuming that the initial conditions are zero.

FIG. 10b illustrates the penalty for assigning the cell $O_i$ to the region $R_{16}$. In this case, the wirelength of the net $E_1$ is 5 units, the wirelength of the net $E_2$ is 7 units, and the penalty $\psi^*$ is 5+7=12 units. Obviously, the penalty of placing the cell $O_1$ in the region $R_{11}$ is smaller than placing it in the region $R_{16}$.

The new available capacity $c_j$ of a region $R_j$ is the initial capacity of the region decreased by the areas of cells already assigned to the region, and can be expressed as $$c^*(j) = c(j) - |\{i | F(i) = j\} \cup V_1|$$

A cost function Ω for the placement resulting from re-assigning the cells of the second subset $V_2$ to the regions $R_j$ is computed as $$\Omega(F) = \sum_{q \in Q} \theta(F)(q)) + \sum_{i \in O} \Psi(i, F(i))$$

where F(q) is the set of all regions into which the cells connected to the set of nets q are assigned, and F(i) is the set of regions into which the cells are mapped.

The first term on the right side of the above equation is the total wirelength of the placement after assigning the cells of the subset $V_2$ to the regions. The second term on the right is the total penalty of the re-assigned cells.

The present invention can be practiced using either or both of these terms. Alternatively, the invention can be practiced using a cost function which does not include either of these terms. Regardless of which cost function is used to determine the quality of the partitioning, the object of the process is to find the assignment for which the cost is minimized.

The assignment problem for assigning the cells of the subset $V_2$ is to find the mapping $F^*$ of the set of vertices $V_2$ to the set of regions R, such that $$\forall j: |\{i | i \in V_2, (F^*(i) = j)\}| \leq c^*(j)$$

and the cost function $\Omega(F^*)$ is minimized.

Modification of the partitioning can be expressed as $$F(i) = \begin{pmatrix} F(i), \text{ if } (i \in V_1) \\ F^*(\xi(i)), \text{ if } (i \in V_2) \end{pmatrix}$$

The preferred method for assigning the cells of the second subset $V_2$ to the regions R will be described below with reference to FIGS. 11 to 20.

As the first step, penalties $\psi$ are specified for assigning each cell of the subset $V_2$ to each region $R_j$ as described above. For cell placement, a penalty can be considered as a negative affinity, with the affinity being an attractive force determined by a conventional force directed placement algorithm based on a model of masses and springs.

Figures 6, 11:
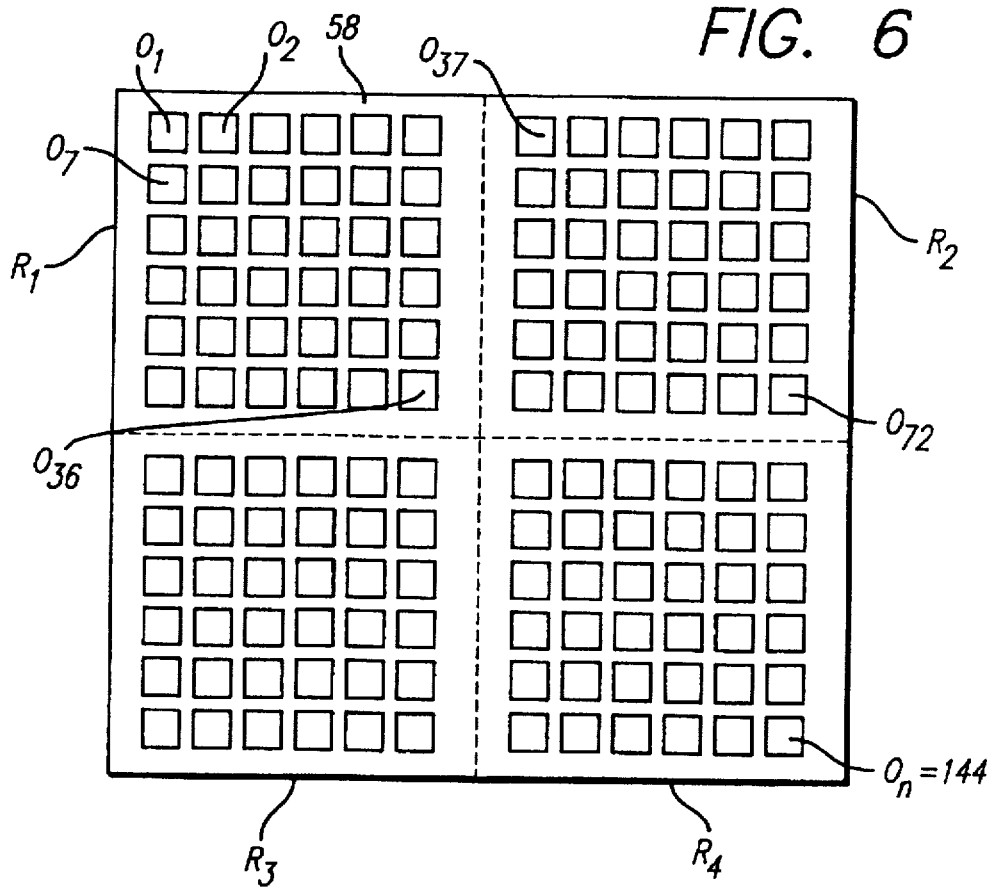
FIG. 6 is a diagram illustrating an initial assignment of a plurality of cells to a plurality of regions on a chip.
FIG. 11 is a diagram illustrating a two dimensional array of penalties for objects and regions.

The number n of cells $O_i$, sizes $s_i$ of cells O, number m of regions $R_j$, capacities $c_j$ of regions m, and penalties $\psi(i,j)$ for assigning the cell $O_i$ to region $R_j$ are specified by the user as a two dimensional array having the form illustrated in FIG. 11. The capacity $c_j$ of a region $R_j$ is the size (area) of the region which is available to have cells placed therein.

There will generally be many more cells than regions. For example, in a typical integrated circuit chip, there can be 100,000 cells to be assigned to four regions. FIG. 6 illustrates a simplified chip 58 in which 36 cells $O_i$ are to be placed in each region $R_j$, where n=144 and m=4. Although the cells $O_1$ to $O_{144}$ are illustrated as having the same size and shape, they can have different sizes and shapes within the scope of the invention.

Figure 12:
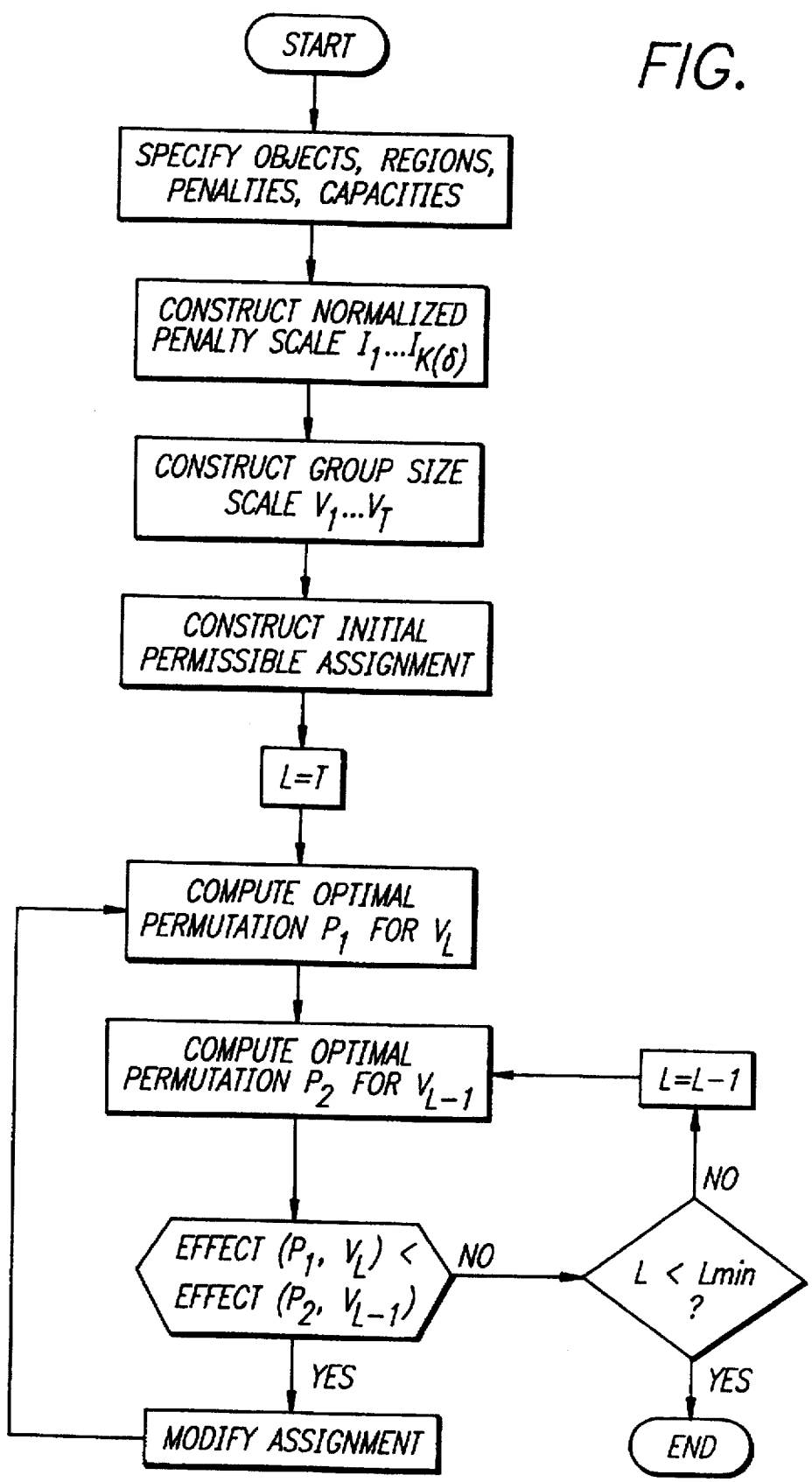
FIG. 12 is a flowchart illustrating an assignment process step of the present invention.

FIG. 12 is a flowchart illustrating the main process steps of the assignment methodology. The following detailed description will be presented within the framework of the flowchart.

The generalized assignment problem can be formulated as follows.

Given set of n cells $O_1 \ldots O_n$ with sizes $s_1 \ldots s_n$, regions $R_1 \ldots R_m$ with capacities $c_1 \ldots c_m$ and a penalty $\psi(i,j)$ of the cell $O_i$ to be in the region $R_j$ for each i=1 ... n and j=1 ... m (n×m matrix).

A permissible assignment F:F(i)=j, of the cell $O_i$ to the region $R_j$ is an assignment which satisfies the condition that for each region, the sum of sizes of all cells assigned to that region is not greater than the capacity of the region. The cost function of the assignment F is equal to the total penalty:

$$COST(F) = \sum_{i=1}^{n} \Psi(i, F(i))$$

The goal is to find the assignment F with the minimal COST(F).

Figures 13, 14, 15:
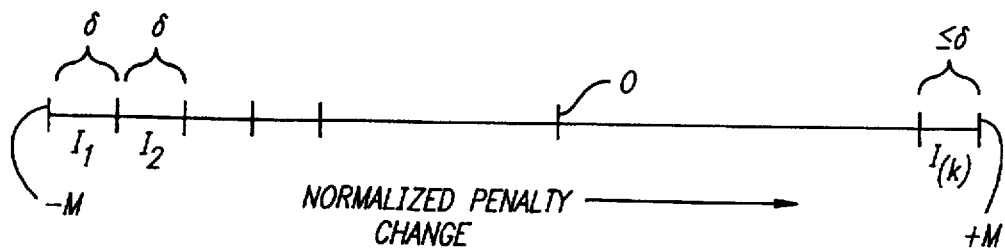
FIG. 13 is a diagram illustrating the construction of a normalized penalty scale.
FIGS. 14 and 15 in combination illustrate the construction of a three dimensional array of normalized penalty summed values for subintervals.

After specifying the cells, regions, capacities and penalties as described above, a normalized penalty change scale is constructed as illustrated in FIG. 13. Normalized penalties $\hat{\psi}(i,j)$ are computed by dividing the penalties $\psi(i,j)$ by the sizes of the cells as $$\hat{\psi}(i,j) = \frac{\psi(i,j)}{s_i}$$

The normalized penalty change $\Delta\psi$ resulting from moving each cell between each two regions is then computed. For example, if an cell has a normalized penalty $\psi_1=-4$ in a region $R_1$ and a penalty $\psi_2=-6$ in a region $R_2$, and is moved from the region $R_1$ to the region $R_2$, the normalized penalty change $\Delta\psi=(-6)-(-4)=12$.

The normalized penalty change scale is specified as having a minimum (most negative) value −M and a maximum (most positive) value +M, where $$M = 2 \times MAX|\psi(i,j)|$$

The normalized penalty change scale is divided into k subintervals $I_r = I_1 \ldots I_k$, where $k \approx 2M/\delta$, and $\delta$ is a constant;

The normalized penalty change scale has maximum values −M and +M equal to twice the maximum value of normalized penalty to accommodate a maximum penalty change in either direction. For example, if the maximum penalty for all cells is −5, and an cell is moved from a region having a penalty of −5 to a region having a penalty of +5, the penalty change will be (+5)−(−15)=+10, or twice the maximum normalized penalty.

Since penalty is the negative of affinity, negative penalty changes are desirable since they decrease the cost of the assignment. It will be noted that if all cells have the same width or height, all normalized penalties $\psi$ will be proportional to the penalties $\psi$ by the same proportionality constant, and the normalization computation can be omitted.

The quantity $\delta$ is the "accuracy factor", and is selected in accordance with the characteristics of the computer on which the design automation program is run. Smaller values of $\delta$ will result in greater accuracy and longer computing time, and vice-versa. It will be further noted that the last subinterval $I_k$ can have a value of less than $\delta$.

The next step in the present process is the construction of a group size scale $V_L = \{C^{L-1}\}$, $C>1$, where $V_L = V_1 \ldots V_T$ are the group size values, C is a constant, and T is a maximum number such that:

$$V_T < \sum_{i=1}^{n} s_i$$

The latter constraint signifies that the total size of cells to be moved cannot exceed the total size of all of the cells. The value C is selected based on characteristics of the particular application, more specifically on the unit of measurement for the cell sizes. If, for example, C=2, the values of $V_L$ will be $V_1=1$, $V_2=2$, $V_3=8$, $V_4=16$, $V_5=32$, etc.

The next step of the present process is to construct an initial permissible assignment which is to be improved upon by the invention. The initial assignment can be generated randomly, or by using another algorithm. The constraint which must be satisfied is, as set forth above, that for each region, the sum of sizes of all cells assigned to that region is not greater than the capacity of the region.

Then, an initial value is assigned to L. The preferred initial value of L is T, although the invention is not so limited. Thus, the initial value of $V_L = V_T$.

The present invention produces a rapid improvement in the initial assignment (and iteratively improved versions thereof) by moving the maximum number of cells between regions which will produce a maximum reduction in the cost of the assignment. This is done by moving the selected number of cells which have the largest negative normalized penalty changes through a complete permutation of the regions.

For example, if there are four regions $R_1-R_4$, one possible permutation is 1-2-3-4, whereas another possible permutation is 1-3-4-2. The number of possible permutations is m-factorial (m!). Thus, for four regions, the number of possible permutations is 4!=24.

No region capacities will be exceeded upon completion of a permutation because the same number of cells is removed from and returned to each region. Although region capacities can be exceeded at intermediate stages of permutations, this does not affect the result of the process.

The number of cells to be moved in the first iteration ($V_L = V_T$) is determined by computing a three dimensional array of cell sizes $\lambda(r,j_1,j_2)$, in which X represents the total size of the cells in each subinterval r for each pair of regions $j_1$ and $j_2$. An cell lies in a subinterval if its normalized penalty change $\Delta\psi$, when the object is moved from $j_1$ to $j_2$, has a value within the subinterval. The array can be expressed as:

$$\lambda(r,j_1,j_2) = \Sigma s_i$$

$$i, F(i)=j_b, (\psi(i,j_2)-\psi(i,j_1)) \in I_r$$

where r is an index for the subintervals and $$\Delta\psi = \psi(i,j_2) - \psi(i,j_1)$$

FIGS. 14 and 15 illustrate the array $\lambda(r,j_1,j_2)$, where FIG. 14 represents a two dimensional portion of the array for a given value of r, and FIG. 15 represents a one dimensional portion of the array for given values of $j_1$ and $j_2$. There are m(m−1) non-trivial values of $\lambda$.

Then, an array of numbers x of subintervals $I_r$ is computed as $$\sum_{r=1}^{x} \lambda(r,j_1,j_2) < V_L < \sum_{r=1}^{x+1} \lambda(r,j_1,j_2)$$

Each value of x is equal to the maximal number of subintervals $I_r$ which contain cells having a total size no greater than $V_L$ for each respective value of $V_L$, and each pair $j_1$, $j_2$.

Thus, for each value of group size $V_L$ (the initial group size is $V_T$), a number x of subintervals containing the corresponding number of cells is computed. Since the subinterval numbers increase with increasing value of normalized penalty change, the cells which produce the maximal reduction in cost function (negative penalty change) are selected for movement.

Figure 16:
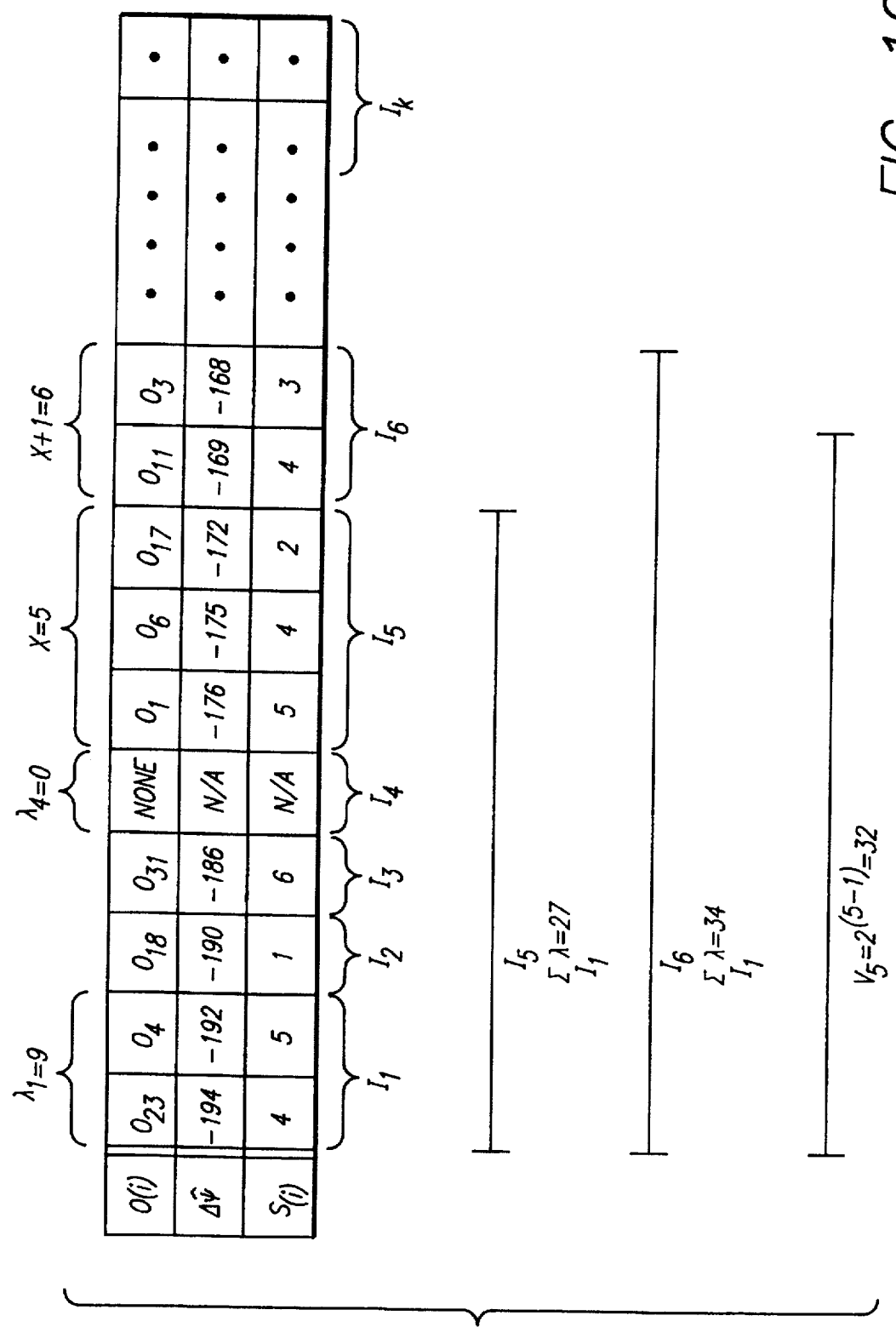
FIG. 16 is a diagram illustrating normalized penalties as assigned to subintervals of the normalized penalty scale.

FIG. 16 illustrates an example of the computation of the values of x for one pair $j_1,j_2$. It will be assumed that MAX$|\psi|$=98, 2M=196 and $\delta$=5. k=196/5=78.4, which is rounded up to 40. Thus, there are 40 subintervals $I_r$, with the subintervals $I_1-I_{39}$ having values of |5|, and the last subinterval $I_{40}$ having a value of |1|.

The values of normalized penalty change $\Delta\psi$ for the first six subintervals $I_1$ to $I_6$ are:

$I_1$ −196 to −192
$I_2$ −191 to −187
$I_3$ −186 to −182
$I_4$ −181 to −177
$I_5$ −176 to −172
$I_6$ −171 to −167

For purposes of example, it will be assumed that T=5, and $V_T=2^{(5-1)}=2^4=32$.

The subinterval $I_1$ includes two cells $O_{23}$ and $O_4$ having normalized penalty changes $\Delta\psi$ of $-194$ and $-192$, and sizes s of 4 and 5 respectively. The subinterval $I_2$ contains one cell $O_{18}$, the subinterval $I_3$ contains one cell $O_{31}$, the subinterval $I_4$ contains no cells, the subinterval $I_5$ contains three cells, and the subinterval $I_6$ contains one cell.

The total group size $V_5=32$. The subintervals $I_1-I_5$ contain cells having a total size of $4+5+1+6+5+4+2=27$. The subintervals $I_1-I_6$ contain cells having a total size of 34. Thus, $x=5$, and $x+1=5+1=6$, for $L=5$. This relationship is further illustrated in FIG. 17.

The next step is to compute an array of penalty changes $\Omega$ as:

$$\Omega(L,j_1,j_2) + \left( \sum_{r=1}^{x} \lambda(r,j_1,j_2)(-M+r\delta) \right) +$$

$$\left( V_L - \sum_{r=1}^{x} \lambda(r,j_1,j_2) \right)(-M+(x+1)\delta)$$

Figures 17, 18:
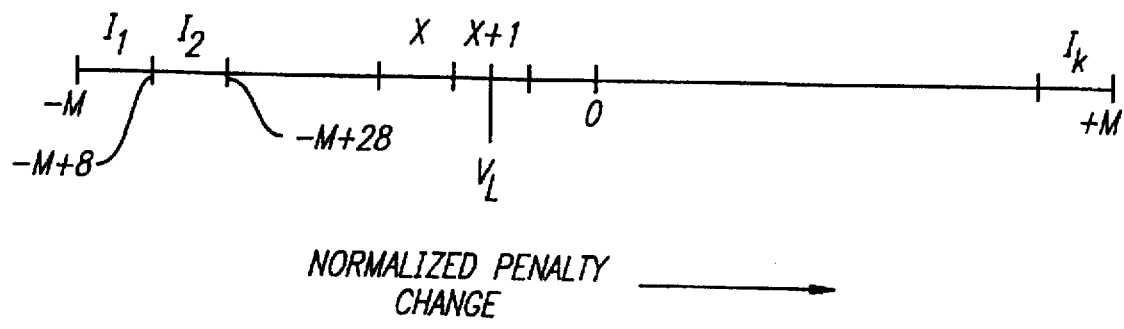
FIG. 17 is a diagram illustrating computation of a subinterval corresponding to a group size.
FIG. 18 is a diagram illustrating a two dimensional array of cost function change values.

This array is illustrated in FIG. 18, in which each element represents the change in total cost function created by moving cells having total size $V_L$ between the corresponding two regions. There is a value of $\Omega$ corresponding to each value of x. FIG. 17 further illustrates how the effect is equal to the product of the total cell size and the value of the subinterval.

With the effect of moving $V_L$ objects between each two regions known, an optimal permutation is determined for which the cost function is reduced by a maximum extent.

The optimal permutation p is expressed as $$p:\{1,2 \ldots m\} \rightarrow \{1,2 \ldots m\}$$

which maps numbers from 1 to m onto themselves.

A cost change EFFECT for each possible permutation p for the selected value of $V_L$ is computed as:

$$\text{EFFECT}(p,V_L) = \sum_{j=1}^{m} \Omega(L,j,p(j))$$

The value of EFFECT is obtained by summing the individual values of $\Omega$ for each move, with a value of EFFECT being computed for each possible permutation. The optimal permutation is the one with the highest negative value of EFFECT (negative change corresponds to reduction of cost function).

The value of L is then decremented, and the process is repeated for the next lowest value of $V_L$. The goal is to determine the highest value of L which will produce an increasing reduction of cost function. If the lower value of L produces a more negative value of EFFECT, the value of L is decremented again until the new lower value produces a less negative value of EFFECT. This is expressed mathematically as:

$$\text{EFFECT}(p_1,V_L) < \text{EFFECT}(p_2,V_{L-1})$$

Figure 20:
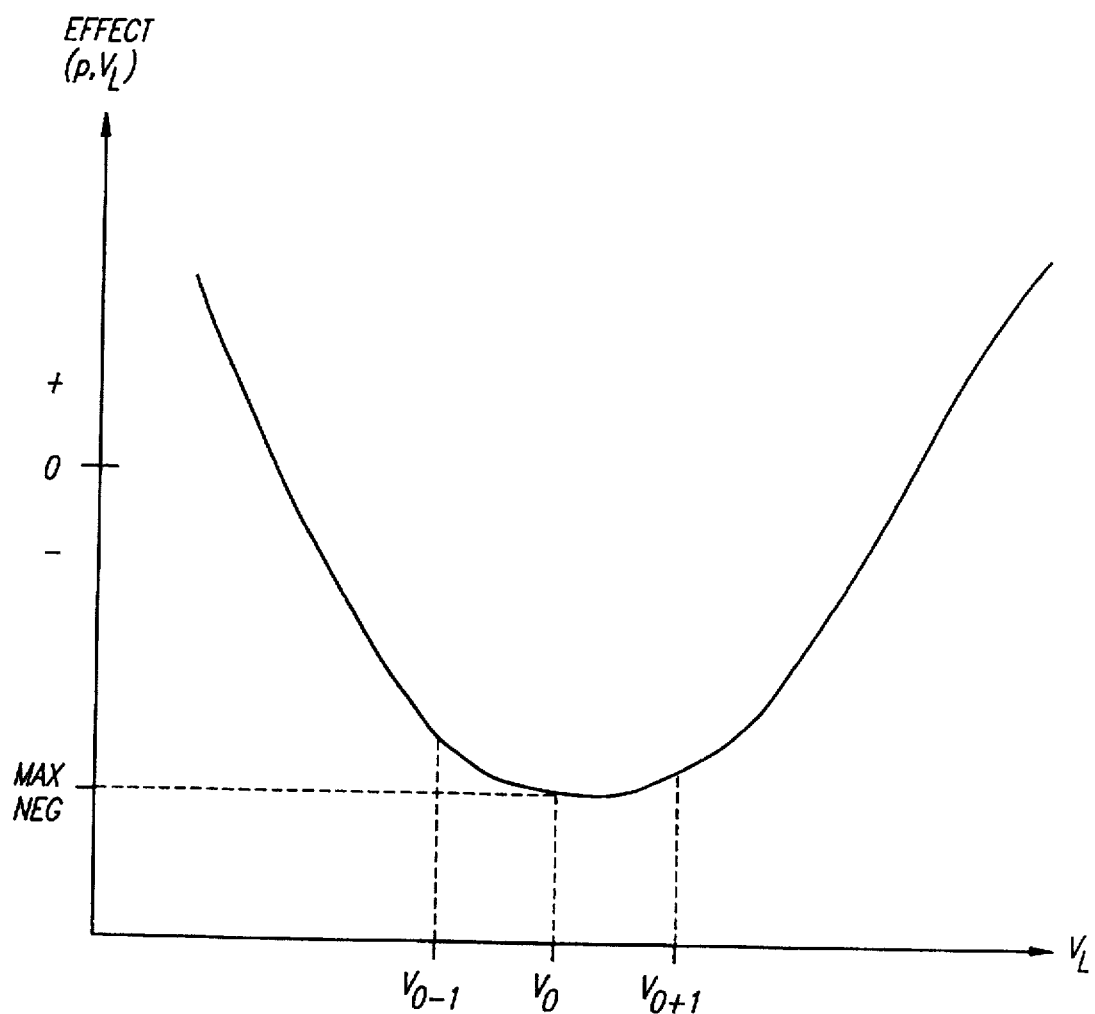
FIG. 20 is a graph illustrating computation of an optimum number of objects for movement.

As illustrated in FIG. 20, $V_o$ represents the current optimal value of $V_L$. It will be seen that the value of EFFECT varies approximately parabolically with $V_L$, and the value of $V_o$ produces a maximum negative value MAX NEG of EFFECT. A higher value $V_o+1$ produces a more positive value of EFFECT, as does a more negative value $V_o-1$.

Once the value $V_o$ and corresponding optimal permutation p have been determined, the assignment is modified by moving the number of cells having size $V_L=V_o$ through the optimal permutation. The cells for movement are selected by determining a subinterval r for each cell as $$(\psi(i,j_2)-\psi(i,j_1))\epsilon I_r$$

If $r \leq x$ (the cell is in a subinterval equal to or larger than x), then $F(i)=j_2$ (the cell is moved).

If $r > x$ (the cell is in a subinterval greater than x), then $F(i)=F(i)$ (the cell is not moved).

If $r=x+1$ (the cell is in the subinterval x), then $F(i)=j_2$ with a probability $$\frac{V_L - \sum_{r=1}^{x} \lambda(r,j_1,j_2)}{\lambda(x+1,j_1,j_2)}$$

In the latter case, a random number generator or the like (not shown) is used to generate numbers with a probability equal to the above value that the numbers will have values greater than a predetermined value. A random number is generated for each cell in the subinterval $x+1$. If the random number is larger than the predetermined value, the cell is moved. If the random number is smaller than the predetermined value, the cell is not moved.

After the assignment is modified, the process branches back as illustrated in FIG. 12 to determine a new optimal permutation for the modified assignment which may or may not have a decremented value of L.

Figure 19:
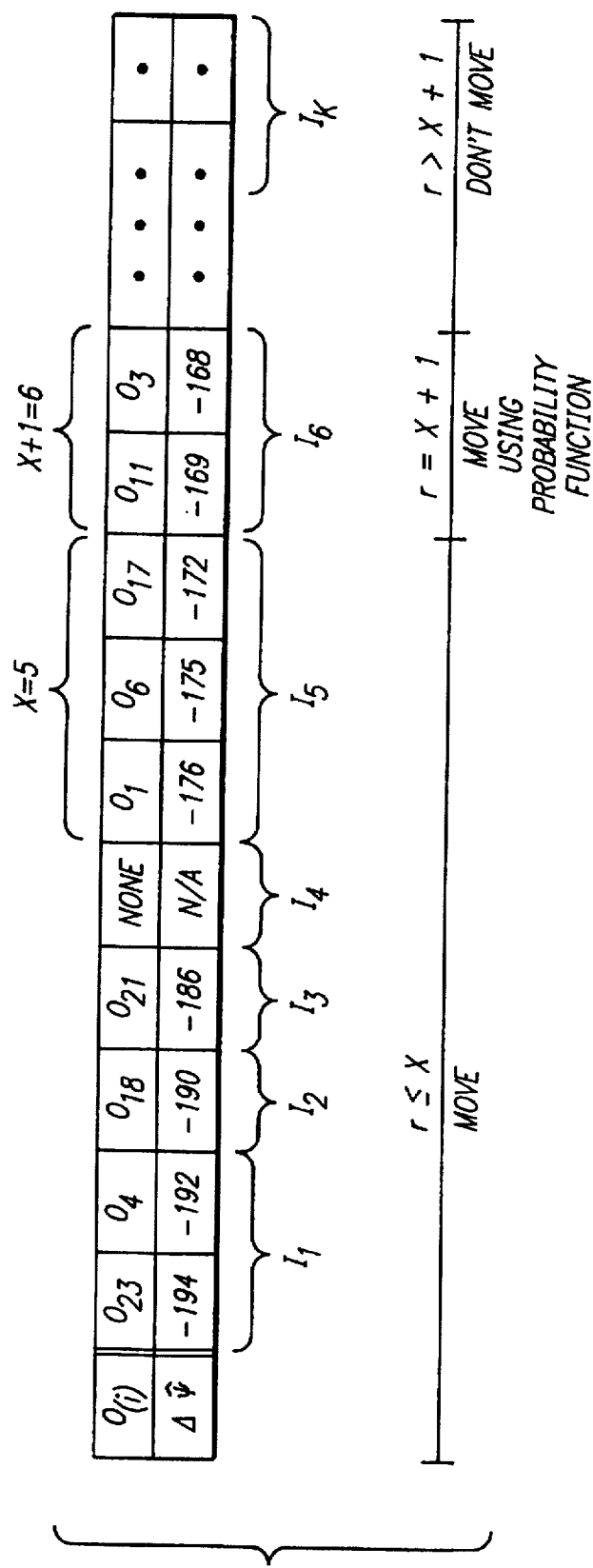
FIG. 19 is a diagram illustrating movement of objects to produce a new assignment.

The modification of the assignment is illustrated in more detail in FIG. 19 for a value of $x=5$. If an cell is in a subinterval having a value r equal to or less than 5, it is moved. If an cell is in a subinterval having a value r greater than $x+1$, it is not moved. If an cell is in the subinterval $x+1$, it is moved with the probability described above.

The present invention solves the partitioning problem and the problem of placing the partitions on the chip simultaneously, therefore overcoming the drawbacks of the prior art. This is accomplished by concurrently assigning cells to more than two regions (multiway), as compared to only two regions (bipartitioning) as in the prior art.

The present invention is also capable of improving on an initial partitioning or assignment produced using a min-cut or other methodology, and can also be considered as a placement improvement process.

The present invention yet further overcomes the limitations of the prior art in that it is capable of operating on cells of different sizes and shapes. The complexity of the present process where implemented on a digital computer is linear, thereby producing results with greatly reduced run times as compared to the prior art.

Various modifications will become possible for those skilled in the art after receiving the teachings of the present disclosure without departing from the scope thereof.

We claim:

1. A process for designing an integrated circuit chip, comprising the steps of:

(a) specifying a set of cells and a set of wiring nets for interconnecting the cells;

(b) specifying a set of regions on the chip in which the cells are to be placed;

(c) generating an assignment of the cells of the set to the regions;

(d) randomly dividing the set of cells into a first subset of cells which remain in the assignment, and a second subset of cells which are removed from the assignment;

(e) computing penalties for assigning the cells of the second subset to the regions respectively; and (f) assigning the cells of the second subset to the regions such that a total penalty thereof is minimized.

2. A process as in claim 1, further comprising the step, performed before step (c), of:

(g) specifying capacities of the regions for containing cells respectively;

in which step (f) comprises assigning the cells of the second subset to the regions such that the capacities are not exceeded.

3. A process as in claim 2, further comprising the step, performed between steps (d) and (e), of:

(h) computing modified capacities for the regions from which the cells of the second subset were removed as being equal to the capacities specified in step (g) minus the sizes of the cells that were removed in step (d);

in which step (f) comprises assigning the cells of the second subset to the regions such that the modified capacities are not exceeded.

4. A process as in claim 1, further comprising the steps, performed after step (f), of:

(g) determining if an end criterion has been reached;

(h) if the end criterion has been reached, terminating the process; and (i) if the end criterion has not been reached, jumping to step (d).

5. A process as in claim 4, further comprising the step, performed between steps (i) and (d), of:

(j) reducing a number of cells of the second subset relative to a number of cells of the first subset.

6. A process as in claim 5, in which the end criterion is such that the number of cells of the second subset has been reduced below a predetermined value.

7. A process as in claim 4, further comprising the step, performed between steps (i) and (d), of:

(j) determining if step (i) has been performed a predetermined number of times without reducing a number of cells of the second subset relative to a number of cells of the first subset;

(k) if step (i) has not been performed a predetermined number of times without reducing the number of cells of the second subset relative to the number of cells of the first subset, jumping directly to step (d); and (l) if step (i) has been performed a predetermined number of times without reducing a number of cells of the second subset relative to a number of cells of the first subset, reducing the number of cells of the second subset relative to the number of cells of the first subset and then jumping to step (d).

8. A process as in claim 1, in which step (e) comprises computing the penalties as wirelengths of all of the nets connected to the cells of the second set respectively.

9. A process as in claim 1, in which step (f) further comprises computing the total penalty as a total wirelength of all of the nets connected to the cells of the second set.

10. A process as in claim 1, in which step (f) comprises the substeps of:

(g) constructing an initial assignment of the cells of the second subset to the regions;

(h) selecting a number of cells of the second subset for movement between the regions;

(i) computing an optimal permutation of movement of the selected number of cells between the regions such that the total penalty is minimized; and (j) modifying the initial assignment by moving the selected number of cells through the optimal permutation.

11. A process as in claim 10, in which step (i) comprises computing the optimal permutation as starting and ending in one of the regions.

12. A programmed digital computer for designing an integrated circuit chip, comprising:

memory means for storing a program including instructions and data; and processing means for executing the program;

the processing means, memory means and program operating in combination for performing the steps of:

(a) specifying a set of cells and a set of wiring nets for interconnecting the cells;

(b) specifying a set of regions on the chip in which the cells are to be placed;

(c) generating an assignment of the cells of the set to the regions;

(d) randomly dividing the set of cells into a first subset of cells which remain in the assignment, and a second subset of cells which are removed from the assignment;

(e) computing penalties for assigning the cells of the second subset to the regions respectively; and (f) assigning the cells of the second subset to the regions such that a total penalty thereof is minimized.

13. A programmed digital computer as in claim 12, in which the processing means, memory means and program further operate in combination to perform the step, before step (c), of:

(g) specifying capacities of the regions for containing cells respectively;

in which step (f) comprises assigning the cells of the second subset to the regions such that the capacities are not exceeded.

14. A programmed digital computer as in claim 13, in which the processing means, memory means and program further operate in combination to perform the step, between steps (d) and (e), of:

(h) computing modified capacities for the regions from which the cells of the second subset were removed as being equal to the capacities specified in step (g) minus the sizes of the cells that were removed in step (d);

in which step (f) comprises assigning the cells of the second subset to the regions such that the modified capacities are not exceeded.

15. A programmed digital computer as in claim 12, in which the processing means, memory means and program further operate in combination to perform the steps, after step (f), of:

(g) determining if an end criterion has been reached;

(h) if the end criterion has been reached, terminating operation; and (i) if the end criterion has not been reached, jumping to step (d).

16. A programmed digital computer as in claim 15, in which the processing means, memory means and program further operate in combination to perform the step, between steps (i) and (d), of:

(j) reducing a number of cells of the second subset relative to a number of cells of the first subset.

17. A programmed digital computer as in claim 16, in which the end criterion is such that the number of cells of the second subset has been reduced below a predetermined value.

18. A programmed digital computer as in claim 15, in which the processing means, memory means and program further operate in combination to perform the steps, between steps (i) and (d), of:

(j) determining if step (i) has been performed a predetermined number of times without reducing a number of cells of the second subset relative to a number of cells of the first subset;

(k) if step (i) has not been performed a predetermined number of times without reducing the number of cells of the second subset relative to the number of cells of the first subset, jumping directly to step (d); and (l) if step (i) has been performed a predetermined number of times without reducing a number of cells of the second subset relative to a number of cells of the first subset, reducing the number of cells of the second subset relative to the number of cells of the first subset and then jumping to step (d).

19. A programmed digital computer as in claim 12, in which step (e) comprises computing the penalties as wirelengths of all of the nets connected to the cells of the second set respectively.

20. A programmed digital computer as in claim 12, in which step (f) comprises computing the total penalty as a total wirelength of all of the nets connected to the cells of the second set.

21. A programmed digital computer as in claim 12, in which step (f) comprises the substeps of:

(g) constructing an initial assignment of the cells of the second subset to the regions;

(h) selecting a number of cells of the second subset for movement between the regions;

(i) computing an optimal permutation of movement of the selected number of cells between the regions such that the total penalty is minimized; and (j) modifying the initial assignment by moving the selected number of cells through the optimal permutation.

22. A programmed digital computer as in claim 21, in which step (i) comprises computing the optimal permutation as starting and ending in one of the regions.

* * * * *